(12) United States Patent
Winslow et al.

(10) Patent No.: US 7,032,651 B2
(45) Date of Patent: Apr. 25, 2006

(54) HEAT EXCHANGER

(75) Inventors: David T. Winslow, Culver City, CA (US); Michael Runyan, Torrance, CA (US); Scott T. Johnson, Torrance, CA (US)

(73) Assignee: Raytheon Company, Waltham, MA (US)

(*) Notice: Subject to any disclaimer, the term of this patent is extended or adjusted under 35 U.S.C. 154(b) by 330 days.

(21) Appl. No.: 10/601,385

(22) Filed: Jun. 23, 2003

(65) Prior Publication Data

US 2004/0256092 A1 Dec. 23, 2004

(51) Int. Cl.
*F28F 7/02* (2006.01)
(52) U.S. Cl. ...................... 165/80.4; 165/185
(58) Field of Classification Search ............... 165/168, 165/80.4, 104.33, 185; 361/699
See application file for complete search history.

(56) References Cited

U.S. PATENT DOCUMENTS

| | | | | |
|---|---|---|---|---|
| 3,481,393 A | * | 12/1969 | Chu | 165/80.4 |
| 4,072,188 A | * | 2/1978 | Wilson et al. | 165/80.4 |
| 4,791,983 A | * | 12/1988 | Nicol et al. | 165/80.4 |
| 5,166,863 A | * | 11/1992 | Shmunis | 361/699 |
| 5,601,141 A | * | 2/1997 | Gordon et al. | 165/168 |
| 6,462,949 B1 | * | 10/2002 | Parish et al. | 361/699 |
| 6,719,039 B1 | * | 4/2004 | Calaman et al. | 165/80.4 |
| 2002/0101718 A1 | * | 8/2002 | Negishi et al. | 361/699 |
| 2003/0024689 A1 | * | 2/2003 | Nakahama et al. | 165/80.4 |

* cited by examiner

*Primary Examiner*—Teresa J. Walberg
(74) *Attorney, Agent, or Firm*—Leonard A. Alkov; Karl A. Vick

(57) ABSTRACT

A heat exchanger apparatus including a two-dimensional array of heat exchanging conduits, wherein each conduit includes an inlet and an outlet, and a manifold for providing heat exchanging fluid to the inputs of the heat exchanging conduits and for receiving heat exchanging fluid from the outputs of the heat exchanging conduits.

25 Claims, 4 Drawing Sheets

HEAT EXCHANGER

BACKGROUND OF THE DISCLOSURE

The subject disclosure is directed generally to heat exchangers, and more particularly to a heat exchanger that can be employed to cool electronics systems such as avionics systems.

Avionics systems are becoming more complex and providing appropriate cooling can be difficult. Typical heat exchangers used in the avionics industry use low density stamped or machined finstock (pins or pin fins) in the range of 12–30 fins per inch (fpi). These heat exchangers provide poor thermal heat transfer characteristics, yielding unit thermal conductances (UTC) on the order of 0.5–2.0 W/sq.-in° C.

SUMMARY OF THE DISCLOSURE

A heat exchanger apparatus comprises a two-dimensional array of heat exchanging conduits, wherein each conduit includes an inlet and an outlet, and a manifold for providing heat exchanging fluid to the inputs of the heat exchanging conduits and for receiving heat exchanging fluid from the outputs of the heat exchanging conduits.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION OF THE DISCLOSURE

Figure 1:
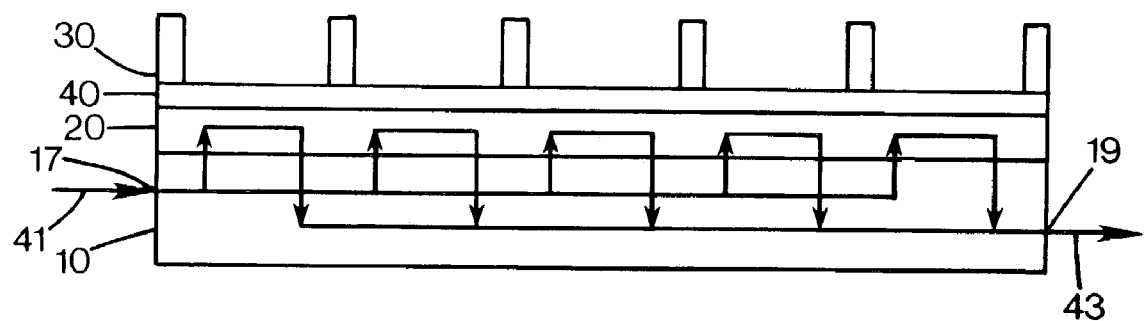
FIG. 1 is a schematic block diagram of an embodiment of a heat exchanger apparatus.

FIG. 1 is a schematic block diagram of an embodiment of a heat exchanger system that includes a manifold network 10 with an array of plenums arranged in a parallel distribution network which supply fluid for the heat exchanger. The heat exchanger includes a core structure 20 that can comprise finstock for example, and a faceplate 40 which seals the assembly. The faceplate 40 side of the assembly receives heat from such sources of heat as electronic components. The heat sources may be mounted on the faceplate, or in a component supporting "eggcrate" or grid 30 that is thermally coupled to the core structure 20 by the faceplate layer.

The manifold network 10 distributes a heat exchanger input stream 41 (FIG. 1) of heat exchanger fluid into a plurality of core element conduits 25 (FIG. 3) of the core structure 20. The heat exchanger fluid flows from manifold inlet plenums or channels 11 (FIG. 2) through the core element conduits 25 and returns to outlet plenums or channels 13 (FIG. 2) of the manifold network 10 which combines fluid received from the various core elements into a heat exchanger fluid output stream 43 (FIG. 1). Each core element conduit can provide for a multiple pass flow of the fluid flowing therein. In this exemplary embodiment, the component support grid 30 can include a plurality of component receiving pockets, and the grid 30 and/or faceplate 40 supports the electronic components or modules that are to be cooled.

Figure 1A:
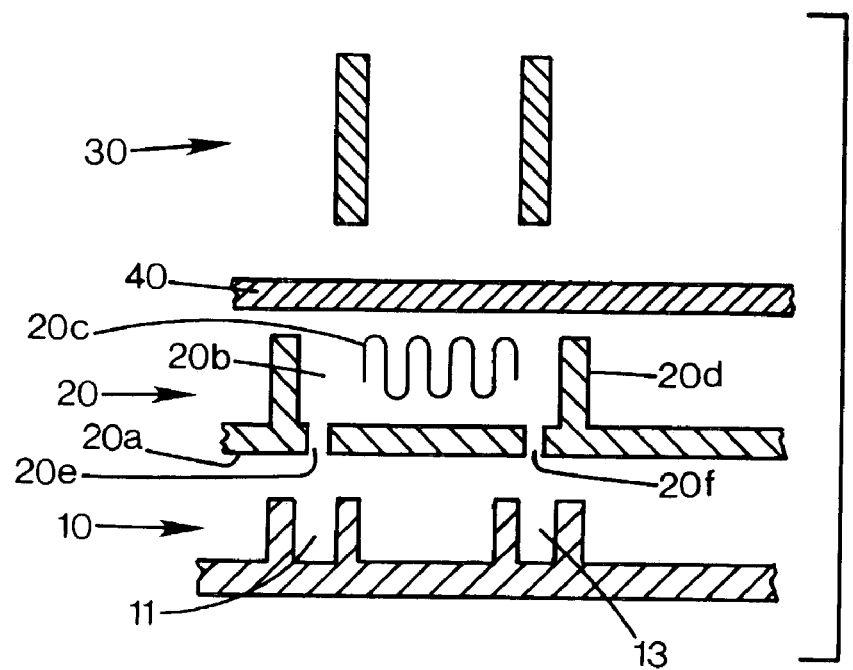
FIG. 1A is a diagrammatic exploded cross-sectional view of the heat exchanger of FIG. 1, illustrating embodiments of the manifold layer, the core structure, the faceplate and the grid.

FIG. 1A is a diagrammatic exploded cross-sectional view of the heat exchanger of FIG. 1, illustrating embodiments of the manifold layer 10, the core structure 20, the faceplate 40 and the grid 30. The layer 20 can include a machined layer 20a having numerous cavities 20b. Within each cavity is a high density stamped or machined finstock 20c. Inlet and outlet openings 20d and 20f are located at each end of the finstock, and correspond to locations of the inlet and outlet plenums 11 and 13 of the manifold network 10.

Figure 2:
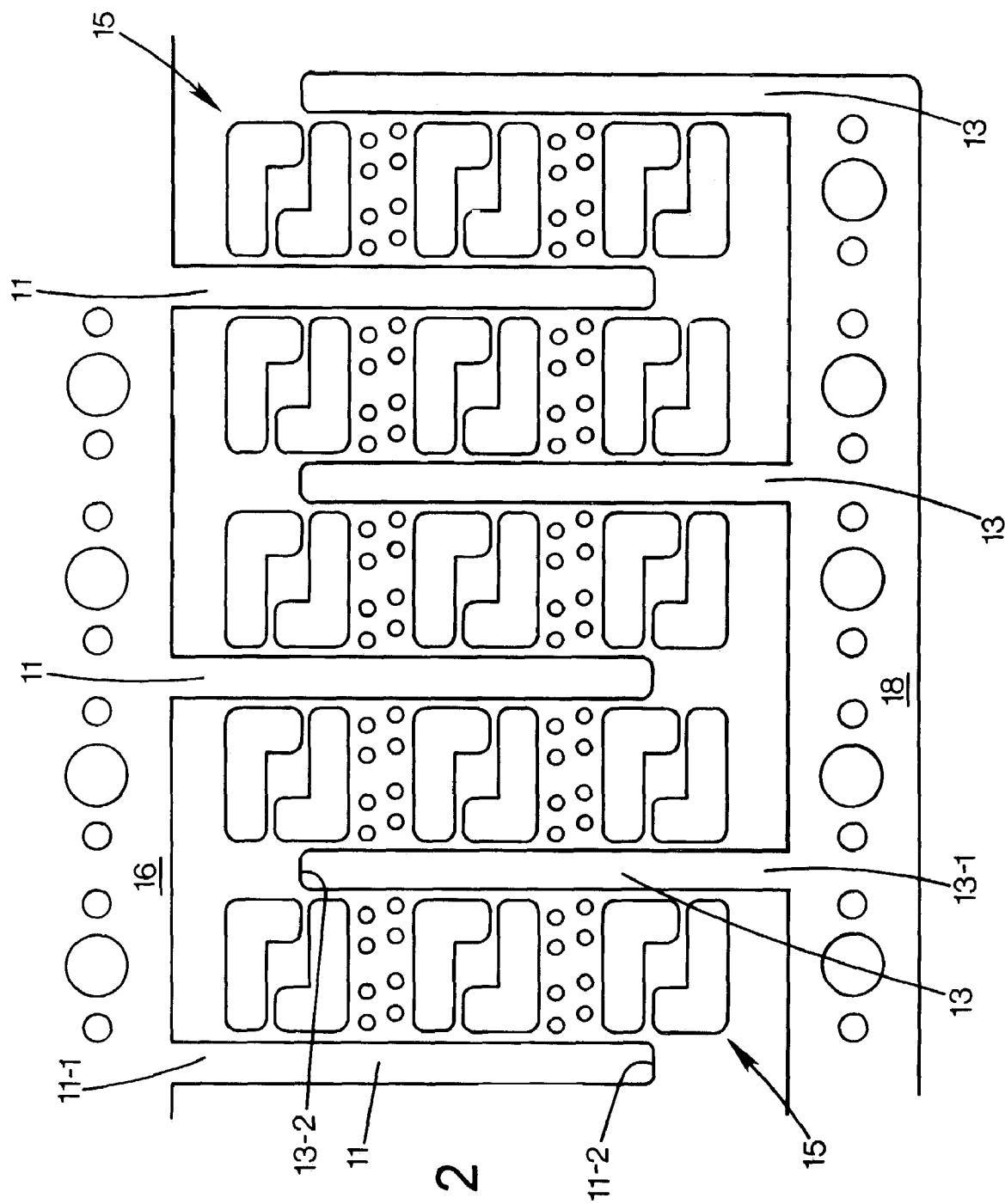
FIG. 2 is a schematic plan view of an embodiment of a manifold network of the heat exchanger of FIG. 1.

FIG. 2 is a schematic plan view of an embodiment of a manifold network 10, as viewed at the interface with the core structure 20. The manifold network includes an inlet supply plenum 16, and a plurality of inlet channels or plenums 11 having an inlet end 11-1 in fluid communication with the inlet supply plenum 16, that provide heat exchanger fluid to the core structure 20, and a distal end 11-2 which is closed, preventing fluid flow through the distal end. The manifold network further includes an outlet or return supply plenum 18 in fluid communication with an outlet end 13-1 of each of a plurality of outlet channels or plenums 13 that receive heat exchanger fluid from the core structure 20. The outlet channels 13 have a closed distal end 13-2. The input plenums 11 and output plenums 13 can be generally parallel and alternating in an inter-digitated manner, for example.

The manifold network can also include a plurality of lightening pockets 15 disposed between the inlet and outlet plenums 11, 13 of the manifold network which also serve as thermal isolation pockets. These pockets are relieved areas which reduce the unwanted warming of the inlet fluid in the inlet plenums, thus further ensuring an even mounting temperature.

The manifold structure can be machined or stamped from a suitable metal or other material. In an exemplary application heat exchange fluid will be pumped into the heat exchanger inlet plenum 16 through an inlet port 17 (FIG. 1), and the heated fluid from the outlet plenum 18 flows out of the heat exchanger through an outlet port 19 (FIG. 1). Fluid thus flows into the inlet ends of the inlet plenums 11, into the core element conduits of the core structure 20, and then into the outlet plenums 13 and into the outlet return plenum 19.

Figure 3:
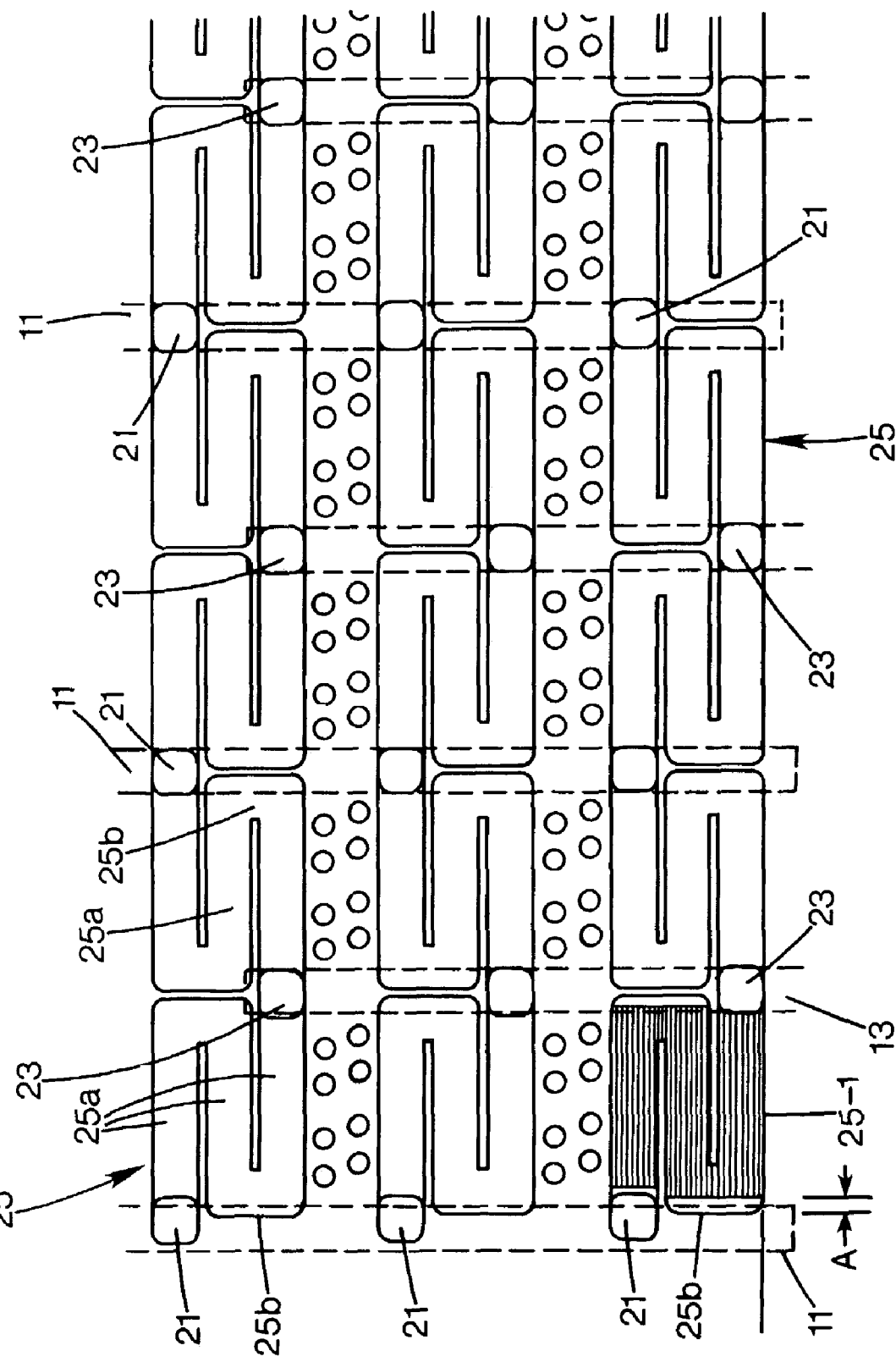
FIG. 3 is a schematic sectional view of an embodiment of a core structure of the heat exchanger apparatus of FIG. 1.

FIG. 3 is a schematic diagram of an embodiment of a core structure 20 that comprises a plurality of core element conduits 25, which can comprise finstock (e.g., stamped aluminum) attached to a facesheet, arranged for example in a two-dimensional array. Each core element conduit 25 includes an inlet 21 and an outlet 23. Each of the inlets 21 is in fluid communication with a corresponding inlet channel 11 of the manifold network, through a hole or opening machined or formed in the top wall of the inlet channel 11 and the structure 20. The openings could also be incorporated into the finstock. Similarly, each of the outlets 23 is in fluid communication with a corresponding outlet channel 13 of the manifold network, through a hole or opening formed in the top wall of the outlet channel 13.

A core element conduit 25 can share an outlet to an outlet plenum 13 with an adjacent core conduit element on one side thereof and/or an inlet from an inlet plenum 11 with an adjacent core conduit element on the other side thereof. Sharing of inlet and outlets in this manner is shown in FIG. 3, wherein the inlet channels 11 and outlet channels 13 of the manifold structure are shown in phantom. The inlets 21 and the outlets 23 can be on the same side of the 2-dimensional array which can be generally planar, for example.

In an exemplary embodiment, each core element conduit 25 can be a multi-pass, serpentine-shaped or S-shaped core element conduit formed of a plurality of finstock legs 25*a* that are serially, fluidically interconnected by turning plenums 25*b*. By way of illustrative example, the finstock legs 25*a* of the core element conduits 25 have a fin density of at least 50 core elements per inch (fpi).

Figure 4A:
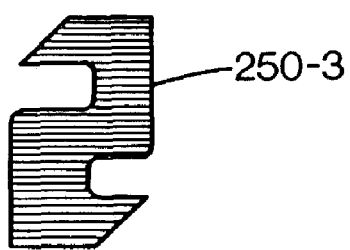
FIGS. 4A–4D illustrate several alternate embodiments of the finstock conduits of the core structure.
Figure 4B:
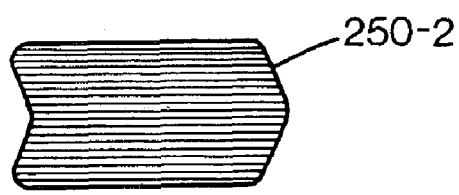
Figure 4C:
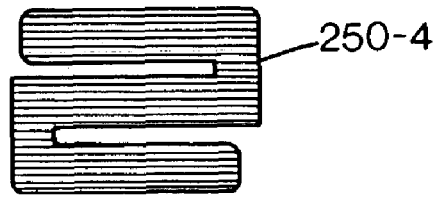
Figure 4D:
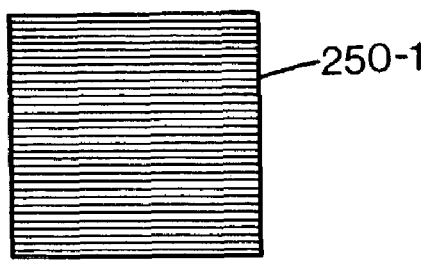

The core element conduits 25 can be arranged in linear arrays each formed of a plurality of interconnected core elements 25. For example, each linear array can comprise a plurality of interconnected serpentine-shaped or S-shaped core element conduits, each sharing an inlet and/or an outlet with an adjacent core element. The core element conduits can be formed of stamped or machined finstock attached to a face sheet 20*a* (FIG. 1A), for example by brazing. Alternatively, the core element conduits can be fabricated of one pass finstock 250-1 (FIG. 4D), wherein a single leg connects the inlet and outlets for the conduit, or two pass finstock 250-2 (FIG. 4B). A serpentine three pass core element 250*3* can have relatively wide spacing between the legs, as illustrated in FIG. 4A, or a narrower spacing between the legs, as shown as 250-4 in FIG. 4C. The particular configuration of the core element conduits can be designed to meet particular pressure drop, flow balance and heat transfer requirements for a particular application.

The manifold network thickness and dimensions of the inlet and outlet plenum channels can be chosen such the pressure drop in the manifold layer is much less than the pressure drop in the core structure 20. This provides an even flow distribution over a large range of heat exchanger flow rates. Also, the manifold 10 can be large enough in cross-section to provide proper flow distribution without necessarily using orifices for flow balancing.

An exemplary embodiment of a heat exchanger provides a high performance and uniform surface temperature heat sink. The exemplary embodiment includes a high-density stamped or machined finstock layer mounted above a parallel-flow manifold network. Individual fin core elements are located beneath high heat density electrical components mounted on the faceplate layer or eggcrate structure. In the exemplary embodiment, the fin densities are greater than 50 fpi. The manifold network is routed between and/or below the fin core elements and thermally isolated to prevent excessive heat influx into the input cooling fluid.

Cooling fluid enters and leaves the finstock layer of the structure 20 via machined openings 21, 23 (FIG. 1A) between the manifold layer and finstock layer. The actual openings can be incorporated into the finstock layer itself. As the cooling fluid enters the finstock layer, in an exemplary embodiment, the fluid flow is split in half, entering two conduits 25 from each inlet hole formed between the manifold layer and finstock layer. Each half of the fluid then goes into a path of high density stamped or machined fin, having a density in excess of 50 fpi in this embodiment. In one exemplary structure, the fin density was 86 fpi, with fins 0.060 inch high and fin material which was 0.005 inch thick. In an exemplary embodiment, the fin core elements are serpentine to increase the pressure drop to further ensure proper flow distribution of the entire heat exchanger. A top layer 40, a facesheet, can be employed to seal the assembly. The facesheet is applied to the assembly side where heat would be inputted from such sources as electronic components attached to the grid 30. The entire assembly may be assembled using a process such as brazing. Other assembly processes can alternatively be employed, e.g. diffusion bonding.

Alternate configurations can be designed in accordance with aspects of the invention, and using a general principle of a parallel distribution system to numerous locations with high density finstock. The manifold layer may be incorporated into the finstock layer to reduce the thickness of the assembly.

Although the foregoing has been a description and illustration of specific embodiments of the invention, various modifications and changes thereto can be made by persons skilled in the art without departing from the scope and spirit of the invention as defined by the following claims.

What is claimed is:

1. A heat exchanger apparatus comprising:
   a two-dimensional array of heat exchanging core element finstock conduits, each core element conduit providing for a multiple pass flow of heat exchanging fluid flowing therein, each core element conduit comprising a plurality of finstock legs that are serially, fluidically interconnected by turning plenums;
   each conduit having an inlet and an outlet;
   a manifold including a plurality of inlet plenums for providing heat exchanging fluid to the inputs of the heat exchanging conduits, and a plurality of outlet plenums for receiving heat exchanging fluid from the outputs of the heat exchanging conduits, and wherein the inlet plenums and outlet plenums are in fluid communication only through said heat exchanging conduits.

2. The apparatus of claim 1 wherein each of the heat exchanging conduits is non-linear.

3. The apparatus of claim 1 wherein each of the heat exchanging conduits is serpentine.

4. The apparatus of claim 1 wherein each of the heat exchanging conduits includes a plurality of interconnected substantially parallel legs.

5. The apparatus of claim 1 wherein the heat exchanging conduits are arranged in linear arrays of heat exchanging conduits.

6. The apparatus of claim 5 wherein adjacent heat exchanging conduits share a common outlet to one of said outlet plenums.

7. The apparatus of claim 5 wherein adjacent heat exchanging conduits share a common inlet to one of said inlet plenums.

8. The apparatus of claim 1 wherein the heat exchanging conduits are arranged in rows and columns.

9. The apparatus of claim 1 wherein the plurality of the heat exchanging conduits includes linear arrays of multi-pass finstock elements.

10. The apparatus of claim 1 wherein the inlets and the outlets of the heat exchanging conduits are on a same side of the 2-dimensional array.

11. The apparatus of claim 1 wherein the heat exchanging conduits comprise finstock elements of at least about 50 fins per inch.

12. The apparatus of claim 1, wherein the inlet plenums and outlet plenums are generally parallel and alternating channels arranged in an inter-digitated arrangement.

13. The apparatus of claim 12, wherein the manifold includes a plurality of thermal isolation pockets disposed between the inlet plenums and outlet plenums.

14. The apparatus of claim 1, wherein the inlet plenums each have an inlet end in fluid communication with a supply of heat exchanger fluid, and a closed distal end.

15. The apparatus of claim 1, further comprising a faceplate layer, said array of heat exchanging conduits sandwiched between said manifold and said faceplate layer.

16. A heat exchanger, comprising:
   a generally planar finstock layer comprising an array of heat exchanging finstock conduits, each conduit having an inlet and an outlet;
   a generally planar manifold layer including a plurality of inlet plenums for providing heat exchanging fluid to the inputs of the heat exchanging conduits, and a plurality of outlet plenums for receiving heat exchanging fluid from the outputs of the heat exchanging conduits, and wherein the inlet plenums and outlet plenums are in fluid communication only through said heat exchanging conduits; and
   a generally planar faceplate layer having a heat input side, the finstock layer being sandwiched between said manifold layer and said faceplate layer.

17. The heat exchanger of claim 16 wherein each of the heat exchanging conduits has a serpentine flow path configuration.

18. The heat exchanger of claim 17 wherein each of the heat exchanging conduits includes a plurality of interconnected substantially parallel legs.

19. The heat exchanger of claim 16 wherein adjacent heat exchanging conduits share a common outlet to one of said outlet plenums.

20. The heat exchanger of claim 19 wherein adjacent heat exchanging conduits share a common inlet to one of said inlet plenums.

21. The heat exchanger of claim 16 wherein each of the heat exchanging conduits comprises a multi-pass finstock element.

22. The heat exchanger of claim 16 wherein the heat exchanging conduits comprise finstock elements having a fin density of at least about 50 fins per inch.

23. The apparatus of claim 16, wherein the inlet plenums and outlet plenums are generally parallel and alternating channels arranged in an inter-digitated arrangement.

24. The apparatus of claim 23, wherein the manifold includes a plurality of thermal isolation pockets disposed between the inlet plenums and outlet plenums.

25. The apparatus of claim 16, wherein the inlet plenums each have an inlet end in fluid communication with a supply of heat exchanger fluid, and a closed distal end.

* * * * *